United States Patent
Cheng et al.

(10) Patent No.: US 8,437,716 B2
(45) Date of Patent: May 7, 2013

(54) BROADCAST RECEIVER AND METHOD FOR REGULATING THE SAME

(75) Inventors: Shin-Shiuan Cheng, Sinshih Township, Tainan County (TW); Guo-Hau Gau, Sinshih Township, Tainan County (TW); Shan-Tsung Wu, Sinshih Township, Tainan County (TW); Shih-Chuan Lu, Sinshih Township, Tainan County (TW); Tien-Ju Tsai, Sinshih Township, Tainan County (TW)

(73) Assignee: Himax Media Solutions, Inc., Tainan County (TW)

( * ) Notice: Subject to any disclaimer, the term of this patent is extended or adjusted under 35 U.S.C. 154(b) by 629 days.

(21) Appl. No.: 12/409,029

(22) Filed: Mar. 23, 2009

(65) Prior Publication Data

US 2010/0240334 A1  Sep. 23, 2010

(51) Int. Cl.
*H04B 1/18* (2006.01)
(52) U.S. Cl.
USPC .................................. 455/193.1; 455/194.1
(58) Field of Classification Search ............... 455/193.1, 455/194.1, 194.2, 195.1, 196.1, 197.1–197.3, 455/198.1, 199.1, 200.1
See application file for complete search history.

(56) References Cited

U.S. PATENT DOCUMENTS 6,650,878 B1 *  11/2003  Abe et al. ................... 455/232.1

FOREIGN PATENT DOCUMENTS

| TW | 200640156 A1 | 11/2006 |
| WO | 2007/081731 A1 | 7/2007 |

OTHER PUBLICATIONS

English translation of abstract of TW 200640156 A1.

* cited by examiner

*Primary Examiner* — Lincoln Donovan
*Assistant Examiner* — Diana J Cheng
(74) *Attorney, Agent, or Firm* — McClure, Qualey & Rodack, LLP

(57) ABSTRACT

A broadcast receiver includes a tuner circuit and a demodulator circuit. The tuner circuit tunes a radio frequency (RF) signal to output an intermediate frequency (IF) signal. The demodulator circuit demodulates the IF signal from the tuner circuit and outputs a command signal based on the quality of the IF signal, for changing a take over point (TOP) value, preset in the tuner circuit, at which one amplitude gain control (AGC) stopping and another taking over. A method for regulating a broadcast receiver is also disclosed herein.

14 Claims, 6 Drawing Sheets

BROADCAST RECEIVER AND METHOD FOR REGULATING THE SAME

BACKGROUND

1. Field of Invention

The present invention relates to a broadcast receiver. More particularly, the present invention relates to a broadcast receiver dynamically adapted for different quality of the input signal.

2. Description of Related Art

For a conventional broadcast receiver having a tuner, there is usually a take over point (TOP) value pre-defined in the tuner, at which a radio frequency amplitude gain control (RF AGC) is activated in place of an intermediate frequency amplitude gain control (IF AGC). The TOP value is allocated with respect to the gain variation or performance of the tuner. For example, if the TOP value is too large, the output signal of the tuner will be influenced due to a small IF amplitude gain; on the contrary, if the TOP value is too small, the output signal of the tuner will be saturated due to a large IF amplitude gain. Alternatively, the take over point (TOP) value may be pre-defined in the tuner, at which an intermediate frequency amplitude gain control (IF AGC) is activated in place of a radio frequency amplitude gain control (RF AGC), in this case, the output of the tuner also could be influenced due to a large or small TOP value, thus affecting the following signal processing. Therefore, it is essential to properly set the TOP value according to the input signal of the tuner.

SUMMARY

In accordance with one embodiment of the present invention, a broadcast receiver is provided. The broadcast receiver includes a tuner circuit and a demodulator circuit. The tuner circuit tunes a radio frequency (RF) signal to output an intermediate frequency (IF) signal. The demodulator circuit demodulates the IF signal from the tuner circuit and outputs a command signal based on the quality of the IF signal, for changing a take over point (TOP) value, preset in the tuner circuit, at which one amplitude gain control (AGC) stopping and another taking over.

In accordance with another embodiment of the present invention, a broadcast receiver is provided. The broadcast receiver includes a tuner circuit, a demodulator circuit and a host circuit. The tuner circuit tunes a radio frequency (RF) signal to output an intermediate frequency (IF) signal. The demodulator circuit demodulates the IF signal from the tuner circuit and outputs an informing signal based on the quality of the IF signal. The host circuit receives the informing signal and outputs a command signal in accordance with the informing signal, for changing a take over point (TOP) value, preset in the tuner circuit, at which one amplitude gain control (AGC) stopping and another taking over.

In accordance with yet another embodiment of the present invention, a method for regulating a broadcast receiver is provided. The method includes the steps of: examining the quality of intermediate frequency (IF) signal and generating a command signal in accordance with the quality of the IF signal; and changing a take over point (TOP) value, preset in a tuner circuit, at which one amplitude gain control (AGC) stopping and another taking over, in accordance with the command signal.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
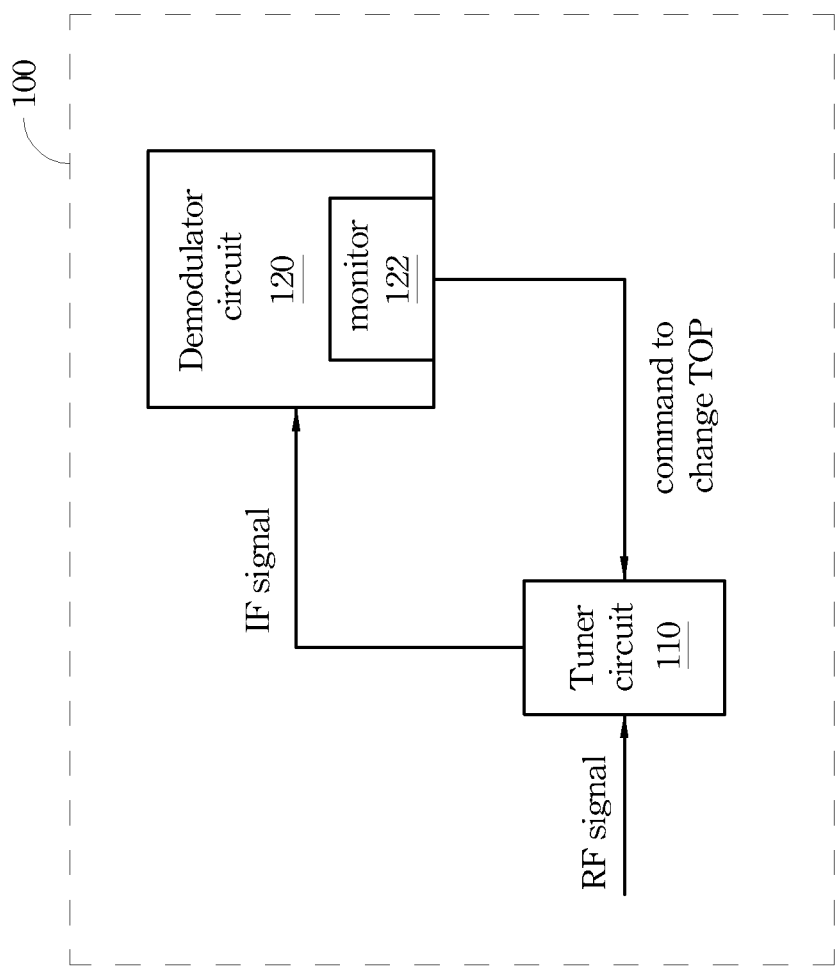
FIG. 1 illustrates a block diagram of a broadcast receiver according to one embodiment of the present invention.

FIG. 1 illustrates a block diagram of a broadcast receiver according to one embodiment of the present invention. The broadcast receiver 100 includes a tuner circuit 110 and a demodulator circuit 120. Practically, the tuner 110 comprises a RF amplifier followed by an IF amplifier. In the tuner circuit 110, there is a preset take over point (TOP) value at which one amplitude gain control (AGC) stops and another takes over; for example, the TOP value is set at which a radio frequency amplitude gain control (RF AGC) is activated in place of an intermediate frequency amplitude gain control (IF AGC). The tuner circuit 110 tunes an RF signal and correspondingly outputs an IF signal based on the TOP value. The demodulator circuit 120 demodulates the IF signal from the tuner circuit 110 and outputs a command signal based on the quality of the IF signal quality, for changing the preset TOP value.

Specifically, if the tuner circuit 110 outputs the IF signal based on the preset TOP value and the quality of the IF signal, such as a bit error rate (BER), a packet error rate (PER), a modulation error rate (MER), a signal-to-noise ratio (SNR), etc., is not as good as desired or fails to meet certain requirement, the demodulator circuit 120 outputs the command signal to change the preset TOP value. Moreover, the demodulator circuit 120 can further include a monitor circuit 122 for monitoring the quality of the IF signal and correspondingly transmitting the command signal to the tuner circuit 110.

In one embodiment, there are two TOP values pre-defined in the tuner circuit 110, and one pre-defined TOP value is changed into the other when the tuner circuit 110 receives the command signal from the demodulator circuit 120; that is, the TOP value is alternately changed between the two pre-defined TOP values. In another embodiment, there is a plurality of TOP values pre-defined in the tuner circuit 110, and the preset TOP value is changed in a round-robin fashion among the TOP values when the tuner circuit 110 receives the command signal from the demodulator circuit 120, in which "round robin" means an arrangement of choosing all elements in a group equally in some rational order, usually from the top to the bottom of a list and then starting again at the top of the list and so on. In yet another embodiment, the demodulator circuit 120 sets the TOP value pre-defined in the tuner circuit 110 according to the RF amplifier at different RF gain values, and the preset TOP value is set when the tuner circuit 110 receives the command signal from the demodulator circuit 120.

Figure 2:
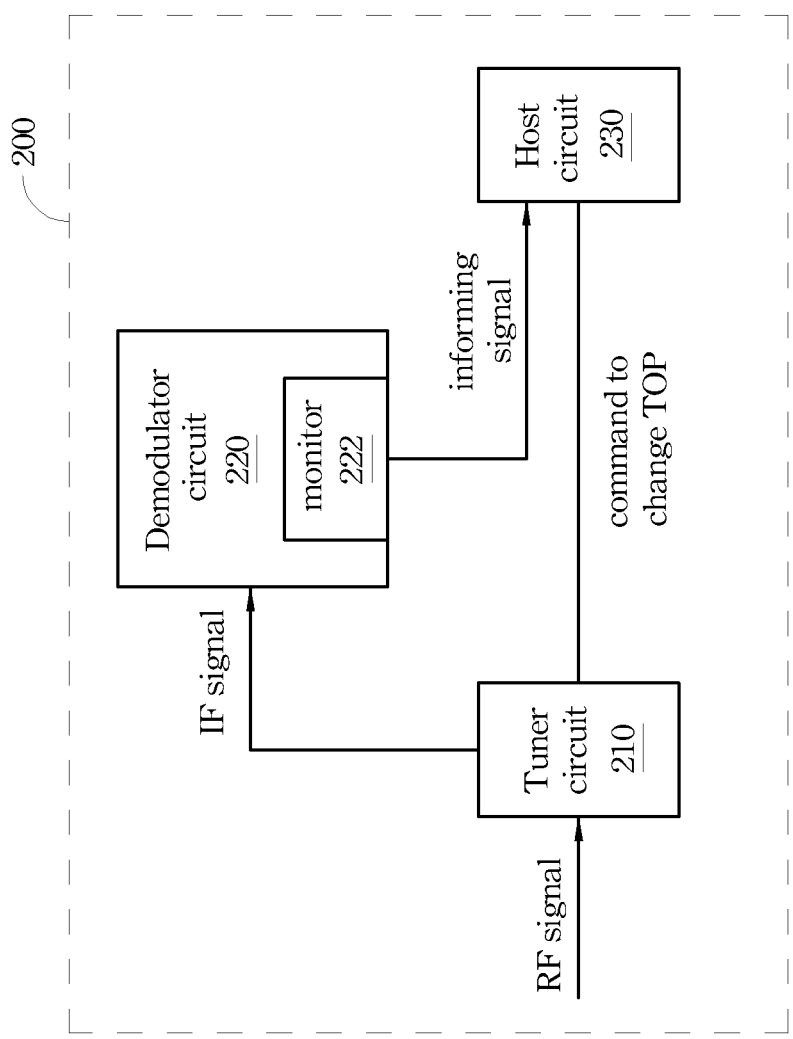
FIG. 2 illustrates a block diagram of a broadcast receiver according to another embodiment of the present invention.

FIG. 2 illustrates a block diagram of a broadcast receiver according to another embodiment of the present invention. The broadcast receiver 200 includes a tuner circuit 210, a demodulator circuit 220 and a host circuit 230. Practically, the tuner 210 comprises a RF amplifier followed by an IF amplifier. The tuner circuit 210 tunes the RF signal and correspondingly outputs the IF signal based on the TOP value. The demodulator circuit 220 demodulates the IF signal from the tuner circuit 210 and outputs an informing signal based on the quality of the IF signal. The demodulator circuit 220 can further include a monitor circuit 222 for monitoring the quality of the IF signal and correspondingly generating the informing signal. The host circuit 230 receives the informing signal from the demodulator circuit 220 and outputs the command signal in accordance with the informing signal, for changing the preset TOP value. The host circuit 230 can be a chip, a processor, etc.

Similarly, if the tuner circuit 210 outputs the IF signal based on the preset TOP value and the quality of the IF signal, such as a bit error rate (BER), a packet error rate (PER), a modulation error rate (MER), a signal-to-noise ratio (SNR), etc., is not as good as desired or fails to meet certain requirement, the demodulator circuit 220 outputs the informing signal to notify the host circuit 230, such that the host circuit 230 is notified to transmit the command signal to the tuner circuit 210. Furthermore, the preset TOP value also can be alternately changed between two pre-defined TOP values, changed in a round-robin fashion among several TOP values, or set as another TOP value according to the RF amplifier at different gain values, as described above.

Figure 3:
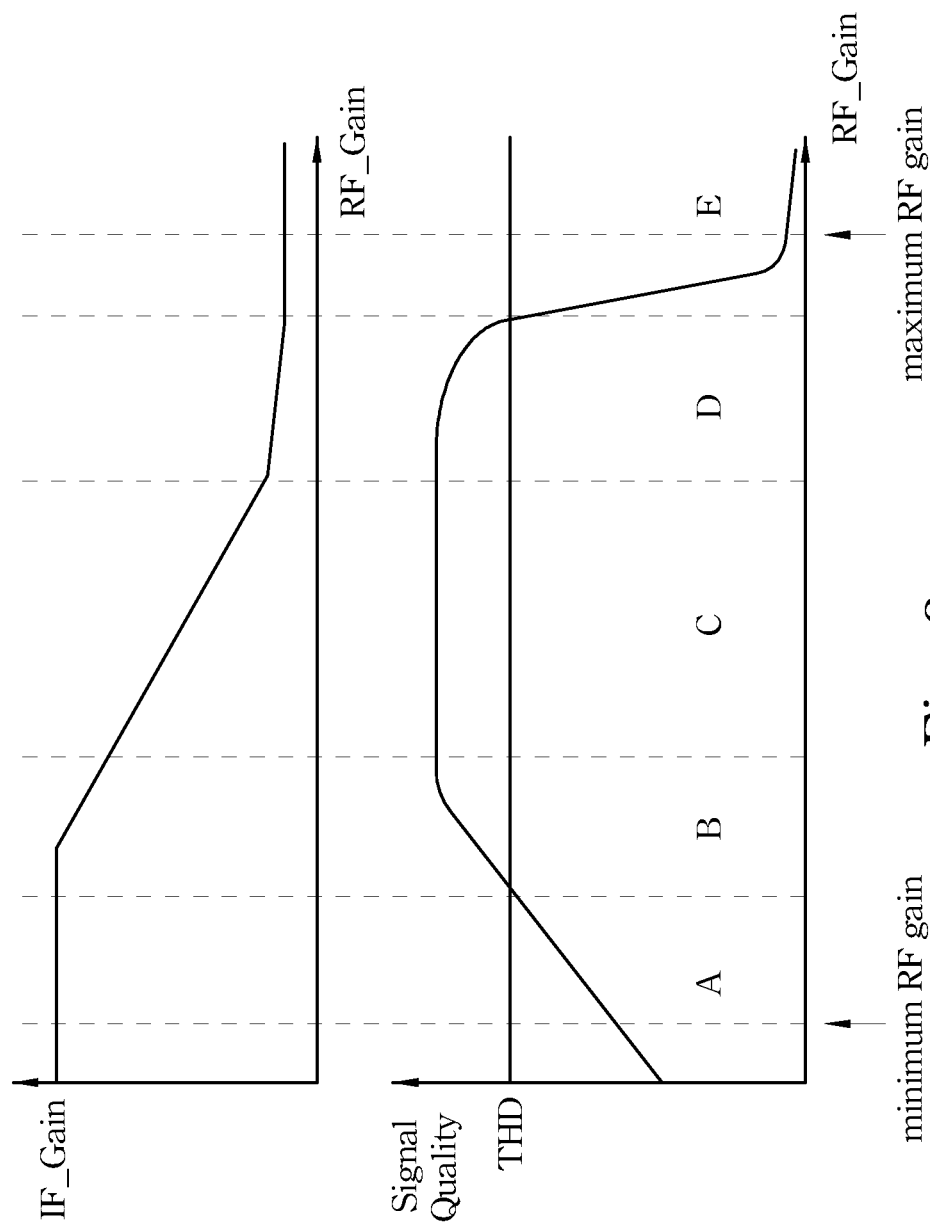
FIG. 3 illustrates the relationships between the RF gain and the IF gain and between the RF gain and the quality of the IF signal when the level of the RF signal is not changed.

The aforementioned TOP value can be set by using different manners. An embodied manner provided for setting the TOP value in the tuner is described as follows. FIG. 3 illustrates the relationships between the RF gain and the IF gain and between the RF gain and the quality of the IF signal when the level of the RF signal is not changed. In more detail, the IF gain decreases as the RF gain increases. Within the areas A and B as shown in FIG. 3, the RF gain is too small such that the quality of the IF signal is influenced and fails to meet certain requirement. Within the area C as shown in FIG. 3, the quality of the IF signal is maintained to be good. Within the areas D and E as shown in FIG. 3, the IF signal is saturated due to the large RF gain and the quality of the IF signal becomes poor again. As a result, the TOP value can be set within the area C as shown in FIG. 3.

Figure 4:
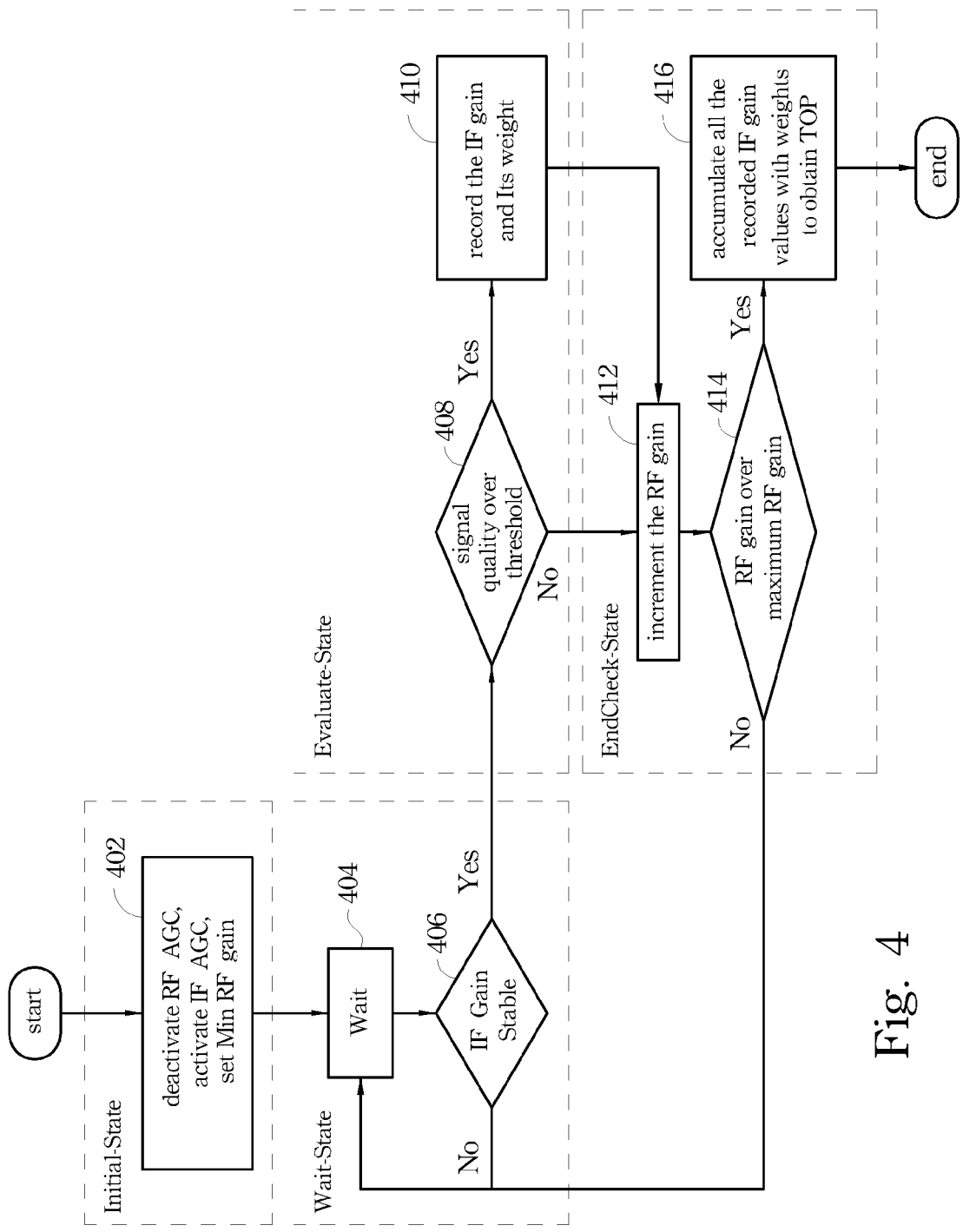
FIG. 4 illustrates a flow chart of obtaining the TOP value according to one embodiment of the present invention.
Figure 5:
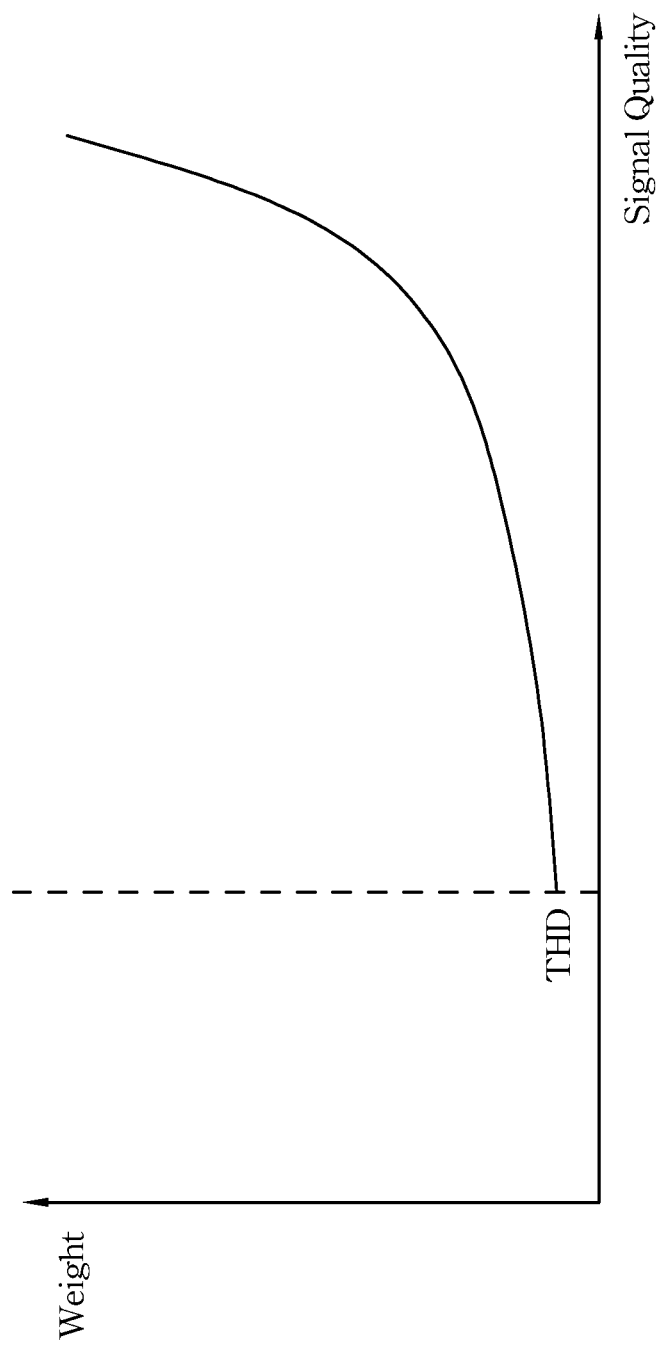
FIG. 5 illustrates the relationship between the weight and the signal quality according to one embodiment of the present invention.

However, since the quality of the IF signal may vary within the area C and the best quality of the IF signal is likely to fall within the area B or D adjacent to the area C, another embodied manner for setting the TOP value is further provided as follows. The TOP value may be set by accumulating the weighted gain values of the IF amplifier (IF gain), wherein the gain values of the IF amplifier respectively correspond to the gain values of the RF amplifier (RF gain) and the gain values of the IF amplifier are weighted according to the quality of the IF signal. In more detail, a plurality of gain values of the RF amplifier is set within a predetermined range. A plurality of gain values of the IF amplifier corresponding to the plurality of gain values of the RF amplifier are obtained. The plurality of gain values of the IF amplifier are accumulated with weights, if the quality thereof is over a predetermined threshold. The TOP value in the tuner is set according to the accumulated outcome. For example, FIG. 4 illustrates a flow chart of obtaining the TOP value according to one embodiment of the present invention. First, RF AGC is deactivated, IF AGC is activated, and RF gain is set as the minimum value (Step 402). Then, the process waits for a predetermined period of time (Step 404), such that a corresponding IF gain can be stably obtained according to the RF gain. After that, whether the IF gain is stable is determined (Step 406). If the IF gain is not stable, the process returns to Step 404. On the other hand, if the IF gain is stable, whether the quality of the IF signal is over a predetermined threshold THD is determined (Step 408). Further, if the quality of the IF signal is over the predetermined threshold THD, a weight corresponding to the quality of the IF signal (such as in direct proportion to the quality of the IF signal) is assigned, and the corresponding IF gain and its weight are recorded (Step 410). In one embodiment, the weight can be set as a function of the quality of the IF signal. FIG. 5 illustrates the relationship between the weight and the signal quality according to one embodiment of the present invention. As shown in FIG. 5, when the quality of the IF signal is over the predetermined threshold THD, the better the quality of the IF signal, the larger the weight is. After step 410, the RF gain is incremented (Step 412). On the other hand, if the quality of the IF signal is not over the predetermined threshold THD, the RF gain is incremented directly (Step 412).

Afterwards, whether the incremented RF gain is over the maximum RF gain is determined (Step 414). If the RF gain is not over the maximum RF gain, the process returns to Step 404, to obtain another corresponding IF gain according to the RF gain. On the other hand, if the incremented RF gain is over the maximum RF gain, the TOP value may be obtained by accumulating all the recorded IF gain with their corresponding weights (Step 416). For example, the TOP value can be obtained by the following formula:

$$TOP = \frac{\sum_{\gamma} IFGain\gamma \times Weight\gamma}{\sum_{\gamma} Weight\gamma}$$

Where $\gamma$ is the index for the recorded IF gains and their weights.

Figure 6:
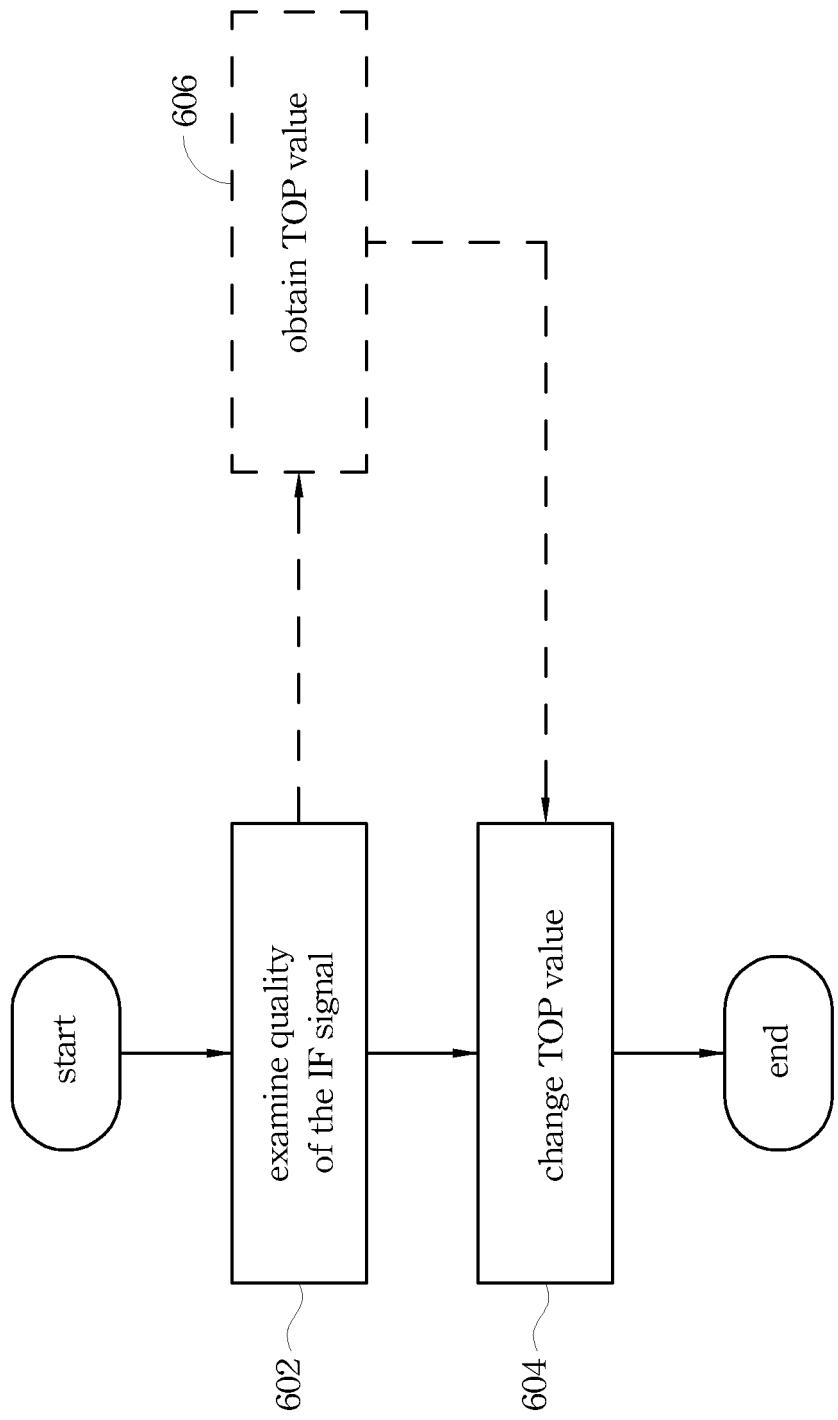
FIG. 6 illustrates a flow chart of regulating a broadcast receiver according to one embodiment of the present invention.

FIG. 6 illustrates a flow chart of regulating a broadcast receiver according to one embodiment of the present invention. First, the quality of the IF signal is examined (Step 602), such as a bit error rate (BER), a packet error rate (PER), a modulation error rate (MER), a signal-to-noise ratio (SNR), etc. or their combination, of the IF signal can be examined. Then, a TOP value preset in a tuner circuit of the broadcast receiver is changed in accordance with the examining result (Step 604). For example, the TOP value can be alternately changed between two pre-defined TOP values in the tuner circuit or changed in a round-robin fashion among a plurality of TOP values in the tuner circuit. In Step 604, a command signal can be generated in accordance with the examining result by the demodulator circuit 120 and transmitted back to the tuner circuit 110 for change of the TOP value, as shown in FIG. 1, or an informing signal can be generated in accordance with the examining result by the demodulator circuit 220, and a command signal can be generated based on the informing signal by a host circuit 230 following the demodulator 220, as shown in FIG. 2, such that the TOP value can be changed according to the command signal.

In another embodiment, after the quality of the IF signal is examined (Step 602), an appropriate TOP value is obtained according to a RF amplifier at different RF gain values (Step 606). For example, a plurality of gain values of the RF amplifier are set within a predetermined range; a plurality of the IF gain values of the IF amplifier corresponding to the plurality of the RF gain values of the RF amplifier can be obtained; and the appropriate TOP value is obtained by accumulating the plurality of gain values of the IF amplifier with their weights if the quality thereof is over a predetermined threshold. After that, the TOP value preset in the tuner circuit of the broadcast receiver is changed into the appropriate TOP value (Step 604).

For the foregoing embodiments of the present invention, the TOP value can be changed and properly set to improve the quality of the IF signal and the performance of the broadcast receiver.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A broadcast receiver, comprising:
   a tuner circuit for tuning a radio frequency (RF) signal to output an intermediate frequency (IF) signal; and
   a demodulator circuit for demodulating the IF signal from the tuner circuit and outputting a command signal based on the quality of the IF signal, for changing a take over point (TOP) value in the tuner circuit;
   wherein the tuner circuit comprises a RF amplifier followed by an IF amplifier and the demodulator circuit sets the TOP value according to the RF amplifier at different gain values, the gain values of the IF amplifier respectively correspond to the gain values of the RF amplifier, the gain values of the IF amplifier are weighted based on weights corresponding to the quality of the IF signal when the quality of the IF signal is over a predetermined threshold, and the TOP value is set by accumulating the weighted gain values of the IF amplifier.

2. The broadcast receiver as claimed in claim 1, wherein the TOP value is alternately changed between two pre-defined TOP values in the tuner circuit.

3. The broadcast receiver as claimed in claim 1, wherein the TOP value is changed in a round-robin fashion among a plurality of TOP values in the tuner circuit.

4. The broadcast receiver as claimed in claim 1, wherein the demodulator circuit outputs the command signal based on a bit error rate (BER), a packet error rate (PER), a modulation error rate (MER) or a signal-to-noise ratio (SNR) of the IF signal.

5. A broadcast receiver, comprising:
   a tuner circuit for tuning a radio frequency (RF) signal to output an intermediate frequency (IF) signal;
   a demodulator circuit for demodulating the IF signal from the tuner circuit and outputting an informing signal based on the quality of the IF signal; and
   a host circuit configured to be notified by the informing signal to output a command signal for changing a take over point (TOP) value in the tuner circuit, wherein the tuner circuit comprises a RF amplifier followed by an IF amplifier and the demodulator circuit sets the TOP value according to the RF amplifier at different gain values, the gain values of the IF amplifier respectively correspond to the gain values of the RF amplifier, the gain values of the IF amplifier are weighted based on weights corresponding to the quality of the IF signal when the quality of the IF signal is over a predetermined threshold, and the TOP value is set by accumulating the weighted gain values of the IF amplifier.

6. The broadcast receiver as claimed in claim 5, wherein the TOP value is alternately changed between two pre-defined TOP values in the tuner circuit.

7. The broadcast receiver as claimed in claim 5, wherein the TOP value is changed in a round-robin fashion among a plurality of TOP values in the tuner circuit.

8. The broadcast receiver as claimed in claim 5, wherein the demodulator circuit outputs the informing signal based on a bit error rate (BER), a packet error rate (PER), a modulation error rate (MER) or a signal-to-noise ratio (SNR) of the IF signal.

9. A method for regulating a broadcast receiver wherein the broadcast receiver comprises a tuner circuit for tuning a radio frequency (RF) signal to generate an intermediate frequency (IF) signal, and a demodulator circuit for demodulating the IF signal, the method comprising the steps of:
   examining a quality of the intermediate frequency (IF) signal and generating a command signal in accordance with the quality of the IF signal; and
   changing a take over point (TOP) value in the tuner circuit in accordance with the command signal, wherein the tuner comprises a RF amplifier followed by an IF amplifier, and the TOP value is set according to the RF amplifier at different gain values, and the setting of the TOP value further comprises:
   setting a plurality of gain values of the RF amplifier within a predetermined range;
   obtaining a plurality of gain values of the IF amplifier corresponding to the plurality of gain values of the RF amplifier, wherein the gain values of the IF amplifier are weighted based on weights corresponding to the quality of the IF signal when the quality of the IF signal is over a predetermined threshold;
   accumulating the weighted gain values of the IF amplifier if the quality thereof is over the predetermined threshold; and
   setting the TOP value according to the accumulated outcome.

10. The method as claimed in claim 9, wherein the TOP value is alternately changed between two pre-defined TOP values in the tuner circuit.

11. The method as claimed in claim 9, wherein the TOP value is changed in a round-robin fashion among a plurality of TOP values in the tuner circuit.

12. The method as claimed in claim 9, wherein the step of examining the quality of the IF signals further comprises:
   examining a bit error rate (BER), a packet error rate (PER), a modulation error rate (MER) or a signal-to-noise ratio (SNR) of the IF signal.

13. The method as claimed in claim 9, wherein the command signal is generated by the demodulator circuit according to the quality of the IF signal.

14. The method as claimed in claim 9, wherein the command signal is generated by a host following the demodulator circuit according to the quality of the IF signal.

* * * * *